United States Patent [19]
Jones et al.

[11] Patent Number: 5,463,347
[45] Date of Patent: Oct. 31, 1995

[54] MOS UNI-DIRECTIONAL, DIFFERENTIAL VOLTAGE AMPLIFIER CAPABLE OF AMPLIFYING SIGNALS HAVING INPUT COMMON-MODE VOLTAGE BENEATH VOLTAGE OF LOWER SUPPLY AND INTEGRATED CIRCUIT SUBSTRATE

[75] Inventors: Steven C. Jones, Garland, Tex.; Subhashish Mukherjee, Bangalore, Ind.; Stephen C. Kwan, Plano, Tex.

[73] Assignee: Texas Instruments Incorporated, Dallas, Tex.

[21] Appl. No.: 353,604

[22] Filed: Dec. 12, 1994

[51] Int. Cl.⁶ .............................. H03F 3/45; H03F 3/16
[52] U.S. Cl. ............................................ 330/253; 330/307
[58] Field of Search .................................. 330/253, 257, 330/260, 277, 307

[56] References Cited

U.S. PATENT DOCUMENTS

| | | | |
|---|---|---|---|
| 4,004,245 | 1/1977 | Ochi et al. | 330/253 |
| 5,242,841 | 9/1993 | Smayling et al. | 437/29 |
| 5,389,891 | 2/1995 | Phillippe | 330/253 |

*Primary Examiner*—Steven Mottola
*Attorney, Agent, or Firm*—W. James Brady, III; Richard L. Donaldson

[57] ABSTRACT

An amplifier, preferably an integrated circuit, capable of accepting input common mode voltages below the circuit reference voltage or substrate voltage in the case of an integrated circuit. The amplifier comprises a differential voltage input having higher and lower voltage terminals, a first NMOS transistor coupled between a voltage supply and the higher voltage terminal and a second NMOS transistor coupled between the voltage supply and the lower voltage terminal. A third NMOS transistor is coupled between the voltage supply and the first transistor gate, a fourth NMOS transistor is coupled between the voltage supply and the second transistor gate and a sink resistor is coupled between the gate of the second transistor and the lower voltage terminal. A differential resistor is coupled between the gates of the first and second transistors. The first and second transistors include a source and a backgate coupled to each other and electrically isolated from the substrate with the source of each of the first and second transistors being coupled to a different one of the input terminals. The third and fourth transistors include a source and a backgate coupled to each other and electrically isolated from the substrate with the source of each of the third and fourth transistors coupled to opposite ends of the differential resistor. The circuit further includes a PMOS mirror circuit for providing an output.

16 Claims, 2 Drawing Sheets

5,463,347

MOS UNI-DIRECTIONAL, DIFFERENTIAL VOLTAGE AMPLIFIER CAPABLE OF AMPLIFYING SIGNALS HAVING INPUT COMMON-MODE VOLTAGE BENEATH VOLTAGE OF LOWER SUPPLY AND INTEGRATED CIRCUIT SUBSTRATE

BACKGROUND OF THE INVENTION

1. Field of the Invention

This invention relates to a differential voltage amplifier capable of amplifying signals having an input common-mode voltage which can be lower than the lower supply voltage or the substrate in the case of an integrated circuit amplifier embodiment.

2. Brief Description of the Prior Art

In many load control systems, monitoring of load current is required as a means of providing feedback to a control loop. For example, in a motor drive system where the motor is the load, control of the load current (current passing through the motor) is required to control motor torque. Typically, load current is monitored by passing such current through a low value resistor of a value usually less than 1 ohm with an amplifer across the resistor to amplify the sensed current to a more usable voltage range. The amplified voltage may then be digitized by an A/D converter and used within a control algorithm or it can be connected to the input of a comparator in a real-time, cycle-by-cycle control loop, etc. A system of this type is shown in FIG. 1 wherein the motor load 1 is coupled via an H-bridge circuit composed of transistors 3, 5, 7 and 9 to the low value sense resistor 11 and then to ground through a voltage offset 13 of up to about ±1 volt with reference to ground or reference voltage, ground or reference voltage also being the substrate voltage when the circuit is an integrated circuit. The voltage across the sense resistor 11 is amplified by a differential amplifier 15.

In low voltage systems such as, for example, automotive applications (about 12 volts), high current levels in about the 20 to 30 ampere range are common. When these currents are switched, as is common when utilizing pulse width modulation (PWM) control techniques, inductive dV/dT spikes and IR drops can cause voltage levels in high current paths to go above or below ground voltage or the voltage of the negative battery terminal. One such path is the load current monitoring path as shown in FIG. 1 where the offset voltage 13 is the result of the voltage spikes and IR drops. When the load is pulsed from the high voltage side of the load with recirculation taking place from the low voltage side of the load, there is a tendency for the voltage across the sense resistor to periodically go negative with reference to ground or the integrated circuit substrate. This presents a particular problem for a current sense amplifier since the amplifier must now be capable of operation with a common mode voltage below ground voltage or, in the case of an integrated circuit, below the substrate voltage. This is also true for a single transistor drive, as would be used in the case of a solenoid or a unidirectional motor, or other types of drive as well as for the exemplary H-bridge configuration as depicted in FIG. 1. Also, the amplifier must often operate from a single voltage supply and the output voltage is usually referenced to a less noisy analog ground voltage.

This problem has existed in bipolar implementations and has been addressed by use of Darlington topology, however these improvements in bipolar technology require additional components and therefore utilize additional die area in the case of integrated circuits, this being undesirable.

SUMMARY OF THE INVENTION

In accordance with the present invention, there is provided an MOS uni-directional, differential voltage amplifier capable of amplifying signals having an input common-mode voltage capable of travel beneath the lower voltage of the voltage supply and beneath the integrated circuit substrate voltage when an integrated circuit is being used. Ordinarily, MOS operational amplifiers (OPAMPs) cannot be used for this task because of the negative common mode voltage which may be present (in such cases, an initial level shifter is required).

The circuit of the present invention is designed using MOS components to make mixed signal integration possible. A unique requirement for this circuit is input NMOS transistors with source and back-gate isolated from the substrate. Use of MOS circuitry eliminates base current errors common in bipolar circuits while use of polycrystalline silicon resistors improves gain accuracy. The circuit meets the criteria for integrating the function in a state of the art process while gaining improvements in accuracy.

Briefly, there is provided an NMOS structure with transistors displaying isolated source and back-gate which can operate at voltages below the P-type substrate. A first pair of such transistors have their source electrodes and back-gates coupled to one of the positive or negative inputs respectively, these transistors having gate electrodes coupled together via a differential resistor ($R_{di}$). The transistors have matched $I_{ds}$ and therefore have $V_{gs}$ tightly matched using current sources coupled to their drain electrodes. Proper biasing maintains the drain electrodes above substrate or ground voltage throughout the full input common mode voltage ($V_{cm}$) operating range to ensure that parasitic drain to substrate isolation diodes are not forward biased. This is accomplished by a two $V_{gs}$ voltage drop provided by each of the above mentioned transistors and a further pair of transistors, one connected from the gate of each of the transistors of the first pair to the positive supply, thus allowing $V_{cm}$ to operate at ≈2 $V_{gs}$ below substrate voltage. The circuit can therefore operate with $V_{cm}$ typically one volt below substrate voltage. For common mode voltages greater than one volt below substrate voltage, additional cascode PMOS transistors can be added in series with each of the further pair of transistors with appropriate adjustment of the gate bias thereof.

Any differential input voltage is reflected to the gate of the transistor coupled to the positive input due to the $V_{gs}$ matching and is imposed across the differential resistor, $R_{di}$, to set up a differential current $I_{di}$ therethrough. This current is passed through the further transistor at the positive input side and the cascode stage, if used, to a PMOS current mirror and then to ground via an output resistor, the output voltage being generated across the output resistor. The differential current $I_{di}$ includes a sink from the differential resistor $R_{di}$ to the negative output.

DESCRIPTION OF THE PREFERRED EMBODIMENTS

Figure 1:
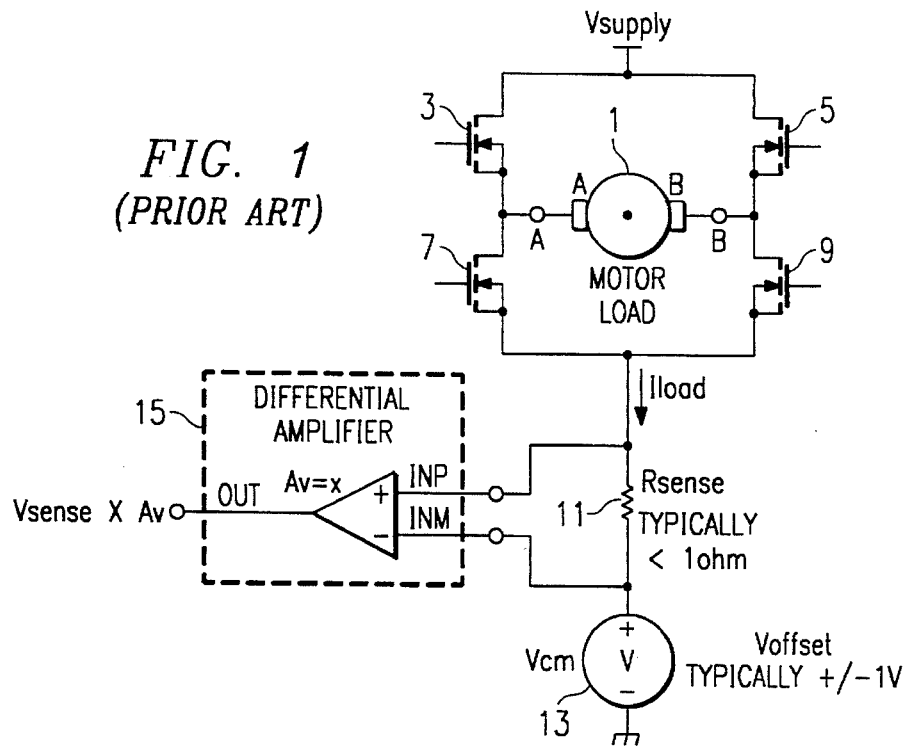
FIG. 1 is a schematic diagram of a prior art load current monitoring circuit.
Figure 2:
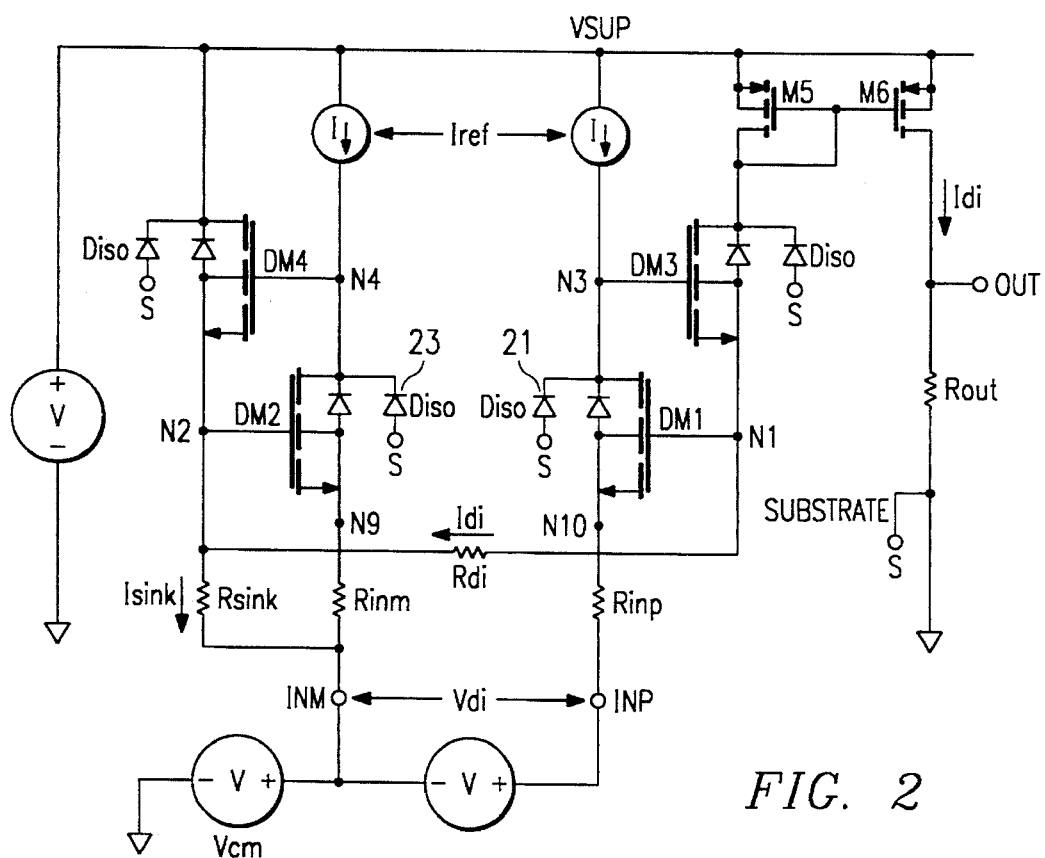
FIG. 2 is a circuit diagram of a first embodiment of an amplifier in accordance with the present invention.

Referring to FIG. 2, there is shown a schematic diagram of an amplifier in accordance with the present invention which combines both voltage level shifting and amplification. The basic circuit concept requires use of an NMOS structure with isolated source and a backgate which can operate at voltages below the voltage of the substrate when fabricated as an integrated circuit.

Common gate connected transistors DM1 and DM2 have $I_{ds}$, and therefore $V_{gs}$, tightly matched using current sources $I_{ref}$. Proper biasing is required to maintain the voltage of the N-tanks containing the drains of transistor DM1 and DM2 (nodes N3 and N4) above substrate voltage or ground throughout the full input common-mode voltage ($V_{cm}$) operating range to ensure the parasitic drain to substrate isolation diodes ($D_{iso}$) 21, 23 do not become forward biased. This is accomplished by the two $V_{gs}$ stack-up of transistors DM1+DM3 and transistors DM2+DM4, thus allowing $V_{cm}$ to operate to $\approx 2\ V_{gs}$ below substrate voltage. The circuit of FIG. 2 can therefore operate with $V_{cm}$ typically one volt below substrate voltage.

For common mode voltages of more than one volt below substrate voltage, additional cascode PMOS transistors (depicted as transistors M7 and M8 in FIG. 3 though transistors M7 and M8 each represent one or more series connected transistors, as may be required) can be added in series with transistors DM3 and DM4 with adjustment of the bias voltage to the gates of the additional transistors to control the voltage bias at nodes N3 and N4, holding these nodes above substrate voltage.

The circuit of FIG. 2 is attempting to measure a small differential input voltage $V_{di}$, amplify this voltage and reference it to ground or some other voltage. This is accomplished by level shifting the differential voltage $V_{di}$ up to nodes 1 and 2. The level shifting is provided by forcing the circuit to allow transistors DM1 and DM2 to conduct equal currents identified as $I_{ref}$. Since transistors DM1 and DM2 are matched, as long as $I_{ds}$ through transistors DM1 and DM2 is the same, the $V_{gs}$ of both transistors DM1 and DM2 will match. Therefore, if the voltages at the sources of transistors DM1 and DM2 are brought up to those of nodes N1 and N2, there is the same differential voltage as appeared at the sources or nodes N9 and N10. Accordingly, by means of the matched $V_{gs}$s of transistors DM1 and DM2, there is a level shift of the differential voltage $V_{di}$ up to the voltage level at nodes N1 and N2.

Transistor DM1 conducts the current $I_{ref}$ as follows:

Node N3 is coupled to the gate of transistor DM3 and to the drain of transistor DM1 with the source of transistor DM3 coupled to the gate of transistor DM1. Until transistor DM1 conducts, the current $I_{ref}$ will cause the voltage at node N3 to rise until transistor DM3 conducts, causing the voltage at node N1 to rise until the $V_{gs}$ of transistor DM1 is sufficient for transistor DM1 to conduct $I_{ref}$, and a quiescent or static operating point is established. Transistor DM1 will turn on and conduct a current $I_{ref}$ and node N3 will end up being biased two $V_{gs}$s up from node N10 (one $V_{gs}$ from node N10 to node N1 and one $V_{gs}$ from node N1 to node N3). Since the source and backgate of transistor DM1 are isolated, they can go negative below the voltage of the substrate and node N3 will track that common mode voltage, but being two $V_{gs}$s up from node 10 (this being well above 1 volt). Therefore, the input, which is connected to the source and the backgate of transistor DM1, can easily go 1 volt below the substrate voltage with node N3 not going sufficiently negative to forward bias the isolation diode $D_{iso}$ 21 directly coupled thereto.

Transistor DM2 operates in an identical manner as discussed above for transistor DM1 since the circuitry coupled thereto is identical to the circuitry coupled to transistor DM1.

The gain is set up in the following manner. Referring to FIG. 2, resistor $R_{di}$ is connected between nodes N1 and N2. If there is a differential voltage across resistor $R_{di}$, it conducts current. Since the amplifier is unidirectional, input INP must be positive relative to input INM. Therefore, as a differential voltage is applied across resistor $R_{di}$ by node N1 rising to a voltage above that of node N2, a current $I_{di}$ flows through resistor $R_{di}$. This current $I_{di}$ must be conducted away at the $R_{sink}$ side of the circuit and there must be a way to source this current on the other side of the circuit, this being at node N1. $I_{di}$ must have a sink path back to INM that alway exceeds the differential input voltage $V_{di}$ divided by $R_{di}$. The left hand stage, composed of transistors DM2 and DM4 will always provide node N2 the difference between $I_{di}$ and $I_{sink}$ currents. Due to the negative voltage involved at nodes N2 and INM, a polysilicon resistor ($R_{sink}$) is used to provide the current sink path with a value such that, under worst conditions the resistance thereof is $V_{gs}(DM2)/R_{sink} > V_{di}/R_{di}$. This current $I_{di}$ comes from transistor DM3 whose $I_{ds}$ is the input to a PMOS mirror composed of transistors M5 and M6. Therefore $I_{di}$ coming out of the mirror M6 is equal to the $I_{di}$ set up by the differential input voltage divided by the resistance of resistor $R_{di}$. To adjust the gain of the circuit, the ratio of the resistances of $R_{out}$ to $R_{di}$ is adjusted wherein the amplification at the output terminal OUT is $R_{out}/R_{di}$. The same result can be obtained by using a mirror having the desired gain ratio built in wherein, for example, transistor M6 will provide twice the current of transistor M5 whereby a gain of two is obtained by having $R_{out}$ and $R_{di}$ at the same resistance value.

To conduct $I_{di}$ away from node N2, there is provided resistor $R_{sink}$ connected between node N2 and input INM. To raise the voltage at node N2, transistor DM4 conducts sufficiently to raise the voltage at node N2 with respect to the voltage at node N9 such that transistor DM2 is conducting current $I_{ref}$. Transistor DM4 must deliver enough current through resistor $R_{sink}$ so that node N2 voltage can rise by $V_{gs}$ to turn on transistor DM2, making transistor DM2 conduct current $I_{ref}$ fed to node N4. Therefore transistor DM4 is delivering the $V_{gs}$ of transistor DM2 divided by $R_{sink}$.

When a differential voltage sets up a current in resistor $R_{di}$, Current from a second source is being delivered to node N2. This current also passes through resistor $R_{sink}$ and raises the voltage at node N2, thereby making transistor DM2 conduct more current. Accordingly, node N4 voltage decreases and cuts off the current through transistor DM4. The current through resistor $R_{sink}$ is therefore still the $V_{gs}$ of transistor DM2 divided by $R_{sink}$. Therefore, what has been set up is a current sinking capability in $R_{sink}$ whereby the current can come either from resistor $R_{di}$ or from transistor DM4. As long as the current set up by the $V_{gs}$ of transistor DM2 divided by $R_{sink}$ is larger than the greatest differential input voltage divided by $R_{di}$, there is a current sinking capability that is adequate.

Figure 3:
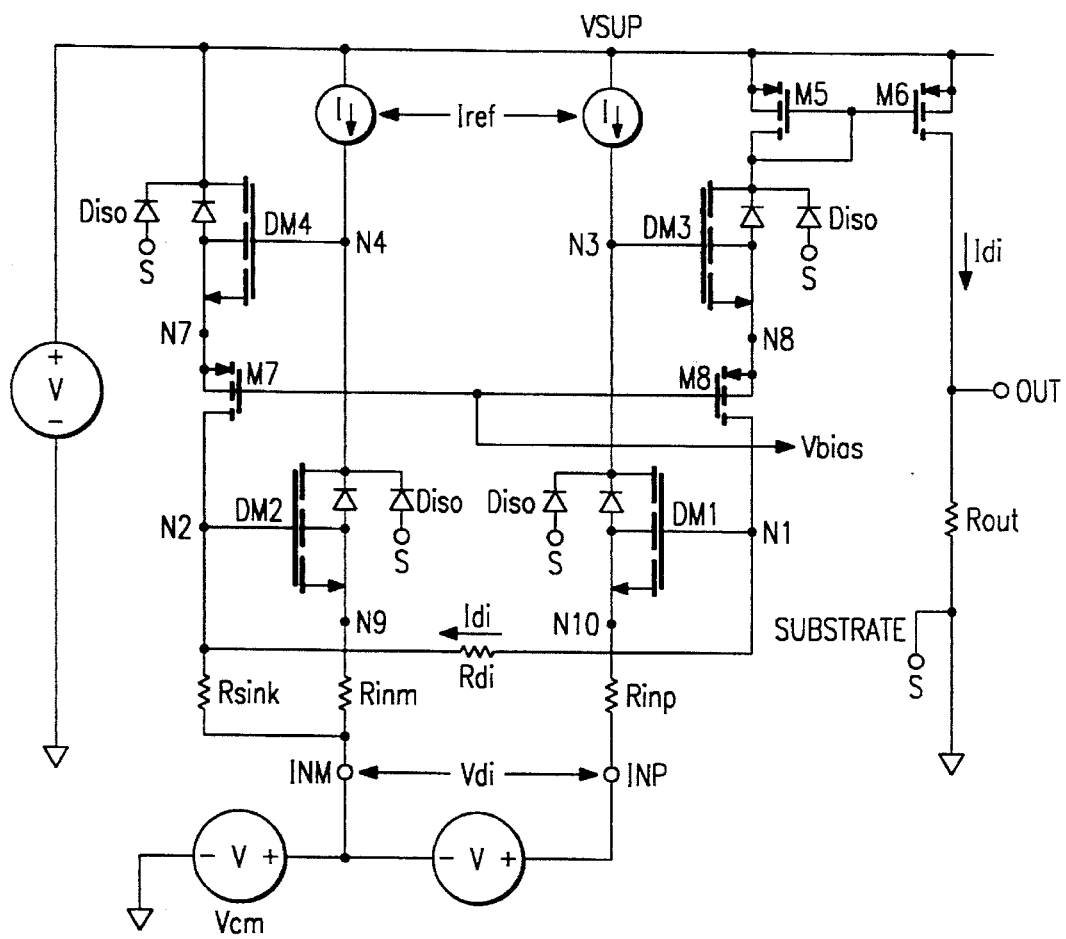
FIG. 3 is a circuit diagram of the amplifier of FIG. 2 with an added cascode stage.

FIG. 3 is an adaptation of FIG. 2 wherein a cascode stage has been inserted with transistor M8 between node N1 and the source-backgate of transistor DM3 or node N8 and transistor M7 between node N2 and the source-backgate of transistor DM4 or node N7. Recalling that a purpose of the circuit is to prevent the drains of transistors DM1 and DM2 from going more than one diode level below the substrate voltage, this circuit will permit the source and backgate of transistors DM1 and DM2 and the drains of transistors M7 and M8 to go to a level well below that of the substrate. Nodes N3 and N4 or the drains of transistors M1 and M2 will be biased to $V_{bias}$ plus two $V_{gs}$s, $V_{bias}$ being a positive voltage with respect to the substrate voltage.

Figure 4:
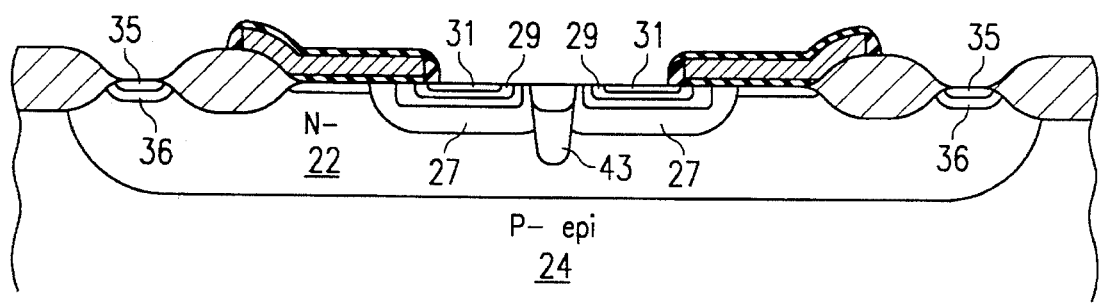
FIG. 4 is a cross-sectional diagram of a transistor as used in accordance with the present invention.

A cross-sectional diagram of a transistor of the type shown in FIGS. 2 and 3 and referenced as transistor DM1, DM2, DM3 and DM4 is shown in FIG. 4 as well as in FIG. 3a of U.S. Pat. No. 5,242,841, the specification of said patent being incorporated herein in its entirety by reference. With reference to FIG. 4, the transistor is disposed in a high voltage N-type tank or well 22 which is diffused into a P-type substrate 24, the tank 22 being the drain of the transistor. The diodes $D_{iso}$ 21, 23 of FIGS. 2 and 3 are the junction between the substrate 24 and the tank or well 22. Within the N-type well 22 is a diffused P-type (DMOS) D-wells 27 which become the backgate for the lateral double-diffused MOS (LDMOS) transistor. Within each P-type well 27 is a further N-type second diffusion region 29 with an N-type region 31, one in each of the regions 29, N-type region 31 forming a source of the transistor. A further drain region 35 is formed in a low voltage N-tank 36 disposed in the tank 22 and spaced from the diffused P-type well 27. A highly doped P+ region 43 is diffused between the regions of P-type well 27 extending into the N-type second diffused region 29 and to the N-type tank 22 but spaced from the N-type region 31. The source and the backgate are externally connected together (not shown). As long as the high voltage N-type tank 22 is positive with respect to the substrate 24, the source 31 and backgate 27 are isolated from the substrate 24 and can go negative. There is voltage compliance between the source and drain, this allowing the source and backgate to go negative relative to the substrate.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. An amplifier capable of accepting input common mode voltages below the circuit reference voltage which comprises:

(a) a differential voltage input having a higher voltage terminal and a lower voltage terminal;

(b) a first NMOS transistor coupled between a voltage supply and said higher voltage terminal;

(c) a second NMOS transistor coupled between said voltage supply and said lower voltage terminal;

(d) a third NMOS transistor coupled between said voltage supply and the gate of said first transistor;

(e) a fourth NMOS transistor coupled between said voltage supply and the gate of said second transistor;

(f) a sink resistor coupled between the gate of said second transistor and said lower voltage terminal; and (g) a differential resistor coupled between the gates of said first and second transistors.

2. The amplifier of claim 1 wherein said amplifier is an integrated circuit and said circuit reference voltage is the voltage of the substrate of said integrated circuit.

3. The amplifier of claim 2 wherein said first and second transistors include a source and a backgate coupled to each other and electrically isolated from said substrate and wherein said source of each of said first and second transistors is coupled to a different one of said input terminals.

4. The amplifier of claim 3 wherein said third and fourth transistors include a source and a backgate coupled to each other and electrically isolated from said substrate and wherein said source of each of said third and fourth transistors is coupled to opposite ends of said differential resistor.

5. The amplifier of claim 1, further including a reference current source coupled between said voltage supply and the drain of each of said first and second transistors.

6. The amplifier of claim 2, further including a reference current source coupled between said voltage supply and the drain of each of said first and second transistors.

7. The amplifier of claim 3, further including a reference current source coupled between said voltage supply and the drain of each of said first and second transistors.

8. The amplifier of claim 4, further including a reference current source coupled between said voltage supply and the drain of each of said first and second transistors.

9. The amplifier of claim 1, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

10. The amplifier of claim 2, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

11. The amplifier of claim 3, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

12. The amplifier of claim 4, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

13. The amplifier of claim 5, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

14. The amplifier of claim 6, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

15. The amplifier of claim 7, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

16. The amplifier of claim 8, further including a mirror circuit comprising a fifth PMOS transistor serially connected to said third transistor and having the gate thereof coupled to the drain thereof and a sixth PMOS transistor coupled between said voltage supply and a source of said reference voltage via a resistor, the gate of said sixth transistor coupled to the gate of said fifth transistor.

* * * * *